US011664265B2

(12) United States Patent
Liu et al.

(10) Patent No.: US 11,664,265 B2
(45) Date of Patent: *May 30, 2023

(54) SYSTEMS AND METHODS FOR ROBOTIC ARM SENSING

(71) Applicant: Taiwan Semiconductor Manufacturing Co., Ltd., Hsinchu (TW)

(72) Inventors: Yan-Hong Liu, Zhudong Township, Hsinchu County (TW); Ming-Feng Chen, Taoyuan (TW); Che-fu Chen, Taipei (TW); Hung-Wen Chen, Hsin-Chu (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 117 days.

This patent is subject to a terminal disclaimer.

(21) Appl. No.: 17/226,362

(22) Filed: Apr. 9, 2021

(65) Prior Publication Data

US 2021/0233797 A1     Jul. 29, 2021

Related U.S. Application Data

(62) Division of application No. 15/883,525, filed on Jan. 30, 2018, now Pat. No. 10,978,333.

(60) Provisional application No. 62/585,752, filed on Nov. 14, 2017.

(51) Int. Cl.
*H01L 21/687* (2006.01)
*H01L 21/677* (2006.01)
*H01L 21/67* (2006.01)

(52) U.S. Cl.
CPC .. *H01L 21/68707* (2013.01); *H01L 21/67253* (2013.01); *H01L 21/67706* (2013.01); *H01L 21/67742* (2013.01)

(58) Field of Classification Search
CPC ......... H01L 21/67253; H01L 21/67706; H01L 21/67742; H01L 21/68707
See application file for complete search history.

(56) References Cited

U.S. PATENT DOCUMENTS 5,553,994 A * 9/1996 Biche .................. H01L 21/6838
                                                    198/750.12
5,668,452 A * 9/1997 Villarreal ............... B25J 19/027
                                                    414/217
5,795,454 A * 8/1998 Friese ................. G01N 27/4078
                                                    277/939

(Continued)

OTHER PUBLICATIONS

Martinez, A.M., "Mechanical design of a robot's gripper", Jun. 2015, Technical Paper, 103 pages.

*Primary Examiner* — Harry Y Oh
(74) *Attorney, Agent, or Firm* — Duane Morris LLP

(57) ABSTRACT

In an embodiment, a robotic arm includes: a base; at least one link secured to the base; a gripper secured to the at least one link, wherein: the gripper comprises a finger, the gripper is configured to secure a wafer while the at least one link is in motion, and the gripper is configured to release the wafer while the at least one link is stopped, a sensor disposed on the finger, the sensor configured to collect sensor data characterizing the robotic arm's interaction with a semiconductor processing chamber while the wafer is secured using the finger.

20 Claims, 5 Drawing Sheets

(56) References Cited

U.S. PATENT DOCUMENTS

| | | | | |
|---|---|---|---|---|
| 6,161,421 | A * | 12/2000 | Fang | G01N 27/128 |
| | | | | 73/23.31 |
| 6,229,118 | B1 * | 5/2001 | Kim | C23C 16/4401 |
| | | | | 118/724 |
| 6,579,052 | B1 * | 6/2003 | Bonora | H01L 21/67769 |
| | | | | 414/940 |
| 6,652,662 | B1 * | 11/2003 | Ishihara | B08B 1/00 |
| | | | | 134/104.1 |
| 10,325,796 | B2 * | 6/2019 | Chen | H01L 21/67742 |
| 2005/0111938 | A1 * | 5/2005 | van der Meulen | |
| | | | | H01L 21/67207 |
| | | | | 414/217 |
| 2005/0113976 | A1 * | 5/2005 | van der Meulen | |
| | | | | H01L 21/67742 |
| | | | | 700/264 |
| 2009/0062959 | A1 * | 3/2009 | Sakhare | H01L 21/67742 |
| | | | | 700/254 |
| 2010/0150687 | A1 * | 6/2010 | Sakata | H01L 21/67781 |
| | | | | 414/222.07 |
| 2012/0255794 | A1 * | 10/2012 | Fenske | H01L 21/67778 |
| | | | | 177/1 |
| 2015/0279718 | A1 * | 10/2015 | Brun | H01L 21/67028 |
| | | | | 156/707 |
| 2016/0141154 | A1 * | 5/2016 | Kamata | H01J 37/32642 |
| | | | | 324/671 |
| 2017/0053819 | A1 * | 2/2017 | Richardson | H01J 37/3244 |
| 2017/0194183 | A1 * | 7/2017 | Xu | B25J 9/1692 |
| 2018/0015614 | A1 * | 1/2018 | Fujimori | H01L 21/68707 |
| 2019/0339119 | A1 * | 11/2019 | Tamatsukuri | G01H 11/06 |
| 2020/0146111 | A1 * | 5/2020 | Sekimoto | H05B 1/0233 |

* cited by examiner

SYSTEMS AND METHODS FOR ROBOTIC ARM SENSING

CROSS-REFERENCE TO RELATED APPLICATION

This application is a division of U.S. patent application Ser. No. 15/883,525, filed Jan. 30, 2018, which claims priority to U.S. Provisional Patent Application No. 62/585,752, filed on Nov. 14, 2017, each of which are incorporated by reference herein in their entireties.

BACKGROUND

Modern assembly line manufacturing processes are typically highly automated to manipulate materials and devices and create a finished product. Quality control and maintenance processes often rely on human skill, knowledge and expertise for inspection of the manufactured product both during manufacture and as a finished product.

Typical assembly line processes for processing wafers (e.g., semiconductor devices or materials) may employ no specific inspection techniques at a robotic arm aside from a manual inspection of robotic arm functionality. A robotic arm for semiconductor device processing may manipulate (e.g., move) a wafer within the robotic arm's work envelope (e.g., a three-dimensional shape that defines the boundaries that the robotic arm can reach and manipulate a wafer). Performance of a typical manual inspection technique may take the robotic arm, and possibly the assembly line that the robotic arm is part of, offline. Such inspection techniques require large amounts of overhead and expensive hardware, but still fail to produce satisfactory results. Therefore, conventional inspection techniques are not entirely satisfactory.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion.

DETAILED DESCRIPTION OF EXEMPLARY EMBODIMENTS

Figure 1:
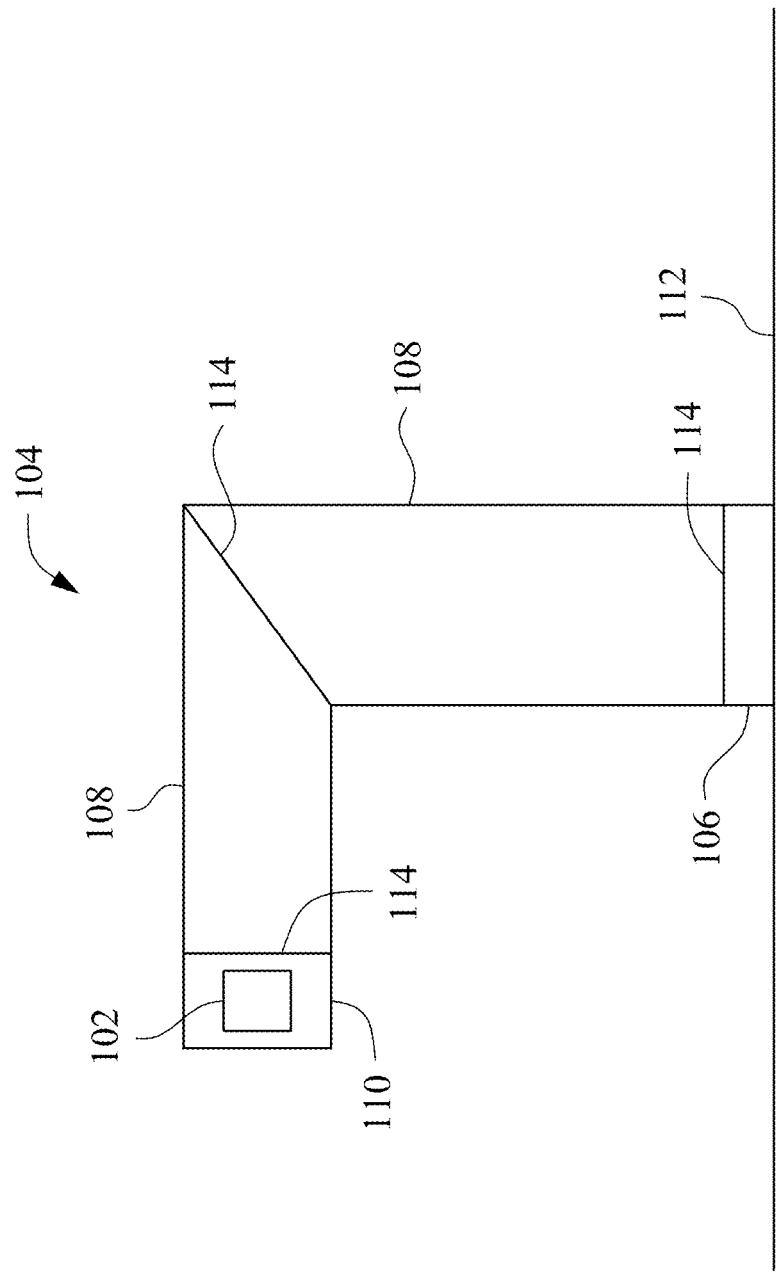
FIG. 1 is a block diagram of a gripper hand sensor on a robotic arm, in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides various embodiments of gripper hand sensing for a robotic arm during semiconductor device processing. A robotic arm may be a programmable mechanical arm to grasp, hold, and manipulate objects (e.g., payloads) such as a wafer. The links of a robotic arm may be connected by joints allowing either rotational motion (such as in an articulated robot) or translational (linear) displacement. The links of the robotic arm may form a kinematic chain. The terminus of the kinematic chain robotic arm may be a gripper hand. The gripper hand may be any type of effector used for grasping or holding an object, such as a wafer, by a robotic arm.

A sensor for the robotic arm may be configured to collect sensor data from around the gripper hand. For example, a sensor may be mounted on or in the gripper hand to collect sensor data from the perspective of the gripper hand. A robotic arm may execute an automated routine as part of a semiconductor assembly line process. For example, the robotic arm may be configured to execute an automated robotic arm routine to move wafers in an automated fashion to and from semiconductor processing chambers, load ports, or components of an automated material handling system. Accordingly, as the gripper hand is operated, sensor data may be collected from the perspective of the gripper hand to ascertain whether an adverse condition is present so as to modify (e.g., stop) a robotic arm routine and/or perform remediation of a semiconductor assembly line process. An adverse condition may be any condition for which it may be desirable to stop or modify a robotic arm routine. For example, an adverse condition may be a prediction an imminent collision of a gripper hand with a surface, such as a wall of a semiconductor processing chamber. This adverse condition may be determined from sensor data collected from around the gripper hand (e.g., gripper hand sensor data) that indicates that the gripper hand has moved to less than a minimum distance to the surface. Accordingly, upon determination of an adverse condition based on gripper hand sensor data, an automated robotic arm routine that would otherwise have caused a collision of the gripper hand to the wall of the chamber may be stopped and/or modified to avoid the adverse condition.

Furthermore, gripper hand sensors (e.g., sensors that collect sensor data from around the gripper hand) may assess an environment that the gripper hand interacts with over time by collecting sensor data from each iteration of an automated robotic arm routine. For example, the gripper hand sensor may collect temperature data on a semiconductor device processing chamber that the gripper hand places wafers into or retrieves wafers from. As another example, the gripper hand sensor may collect weight data from the various wafers that the gripper hand may handle. Accordingly, by analyzing the aggregated data from various iterations of a robotic arm routine, an adverse condition may be determined based on detection of an outlier from the aggregated data. In certain embodiments, these outliers may determine threshold values, which when passed, may define an adverse condition. These outliers may be determined in accordance with conventional statistical analysis for outliers. For example, these outliers may define threshold values for a wafer that is too heavy or too light, which may be indicative of a wafer that is broken or improperly grasped or held. As another example, these outliers may define threshold values for a semiconductor processing chamber that is too hot or too cold (which may be indicative of a semiconductor processing chamber that may be malfunctioning).

FIG. 1 is a block diagram 100 of a gripper hand sensor 102 on a robotic arm 104, in accordance with some embodiments. As introduced above, the robotic arm 104 may be a programmable mechanical arm to grasp, hold, and manipulate objects. The robotic arm 104 may include a base 106, at least one link 108, and the gripper hand 110. The gripper hand 110 may be any type of effector used for grasping or holding an object, such as a wafer, by the robotic arm 104. The gripper hand may utilize any type of gripping mechanism to manipulate an object, such as a wafer. For example, the gripping mechanism may be a pressure gripper (e.g., gripping by applying pressure to an object, such as with a pincer type motion), an envelope gripper (e.g., gripping by surrounding an object to be manipulated), a vacuum gripper (e.g., gripping by suction force), and a magnetic gripper (e.g., gripping by use of electromagnetic forces). In certain embodiments, the gripper hand may utilize at least two fingers, with one opposing the other. The multiple fingers may be utilized to apply pressure as a pressure gripper and or as an envelope gripper.

The base 106 may be a secured point at a terminus of the robotic arm. The base may be utilized to stabilize the robotic arm. For example, the base 106 may be a part of the robotic arm that interacts with, and secures the robotic arm relative to, a surface 112 on which the robotic arm rests. The surface 112 may be the ground or a platform on which various semiconductor processing devices, such as semiconductor device processing chambers, may rest. In certain embodiments, the base 106 may be secured via screws or other mechanical adhesives that adheres the base to the surface 112.

The at least one link 108 of the robotic arm may be at least one piece that connects the gripper hand 110 with the secured base 106. The at least one link may be interconnected by joints 114 allowing either rotational motion (such as in an articulated robot) or translational (linear) displacement. Accordingly, the at least one link 108 of a robotic arm may form a kinematic chain with terminuses at the gripper hand 110 or the base 106. For example, the robotic arm 104 may include a single link with two joints between the link and the gripper hand 110 and the base 106 or may include multiple links (e.g., two links 108) with respective joints 114 between the links. The joints 114 may be powered by a variety of means, including electric motors. The joints may provide the robotic arm with degrees of freedom, or an amount of independent motions in which the gripper hand may be moved.

A gripper hand sensor 102 may be a sensor mounted on, or within, the gripper hand 110. The gripper hand sensor 102 may collect sensor data from the perspective of the gripper hand 110. This sensor data may be utilized to characterize an environment that the gripper hand 110 is exposed to, such as the surroundings of the gripper hand 110, an object gripped by the gripper hand 110 or a surface that touches the gripper hand 110. As will be discussed further below, this sensor data may be utilized in the performance of a gripper hand sensor process, which may determine whether an adverse condition is present. The gripper hand sensor may be any type of sensor utilized to collect sensor data. For example, the gripper hand sensor may be at least one of a radar monitor (e.g., a frequency modulated continuous wave (FMCW) radar monitor), an image sensor (e.g., a CCD image sensor), a weight sensor (e.g., a weight sensor), an electronic nose sensor (e.g., a gas molecule detector), an infrared range finder, and/or an infrared thermometer. In certain embodiments, it may be desirable to utilize gripper hand sensors that are as small as practical, such as to not add unnecessary bulk to the gripper hand that may interfere with the operations of the gripper hand.

In various embodiments, different types of gripper hand sensors may collect different types of sensor data for different uses. For example, a radar monitor sensor may collect frequency modulated continuous wave (FMCW) sensor data that can be utilized to determine a spatial relationship, velocity, speed, or rate of movement as well as distances to objects. An image sensor may collect image data that can be utilized to characterize an image or a video of the surroundings of the gripper hand, for purposes such as to determine whether a semiconductor processing chamber has any abnormality. A weight sensor may collect real time weight sensor data that characterizes a wafer weight, for purposes such as to determine wafer chipping or breakages. An electronic nose sensor may collect gas molecule sensor data (e.g., the presence of particular gas molecules), for purposes such as to determine whether there are an abnormal concentrations of gas molecules around the gripper hand (e.g., within a semiconductor processing chamber). For example, the electronic nose sensor may collect gas molecule sensor data to determine whether wafer outgassing has occurred during semiconductor processing. A range finder, such as an infrared range finder may collect infrared range data on distances to a surface (e.g., distance form a gripper hand to a surface of the chamber), for purposes such as to control robot arm leveling. A thermometer, such as an infrared thermometer, may be utilized to determine the temperature at the gripper hand and/or within a chamber that the gripper hand may interact with.

In addition, various sensor tools that may facilitate the gathering of sensor data may also be collocated, or proximal to the gripper hand sensor. For example, a light source, such as a micro laser emitting diode (LED) light, may be a sensor tool for an image sensor to illuminate an area from which sensor data is collected. Accordingly, the sensor tool may be configured to work in conjunction with the respective sensor, such as a light source providing illumination (e.g., a flash) when the image sensor is collecting image data. As another example of a sensor tool, a gas nozzle and/or a vacuum tip may be utilized to facilitate detection of gas molecules by the electronic nose sensor. For example, the vacuum tip may be utilized to vacuum or bring gas molecules toward the electronic nose sensor and the gas nozzle may be utilized to eject gas molecules away from the electronic nose sensor.

Although FIG. 1 illustrates a robotic arm 104 with only a single base 106 and a single gripper hand 110, a robotic arm may have any number of bases and/or gripper hands as desired for different applications in accordance with various embodiments. For example, a robotic arm may have a single base and two or more gripper hands.

Figure 2:
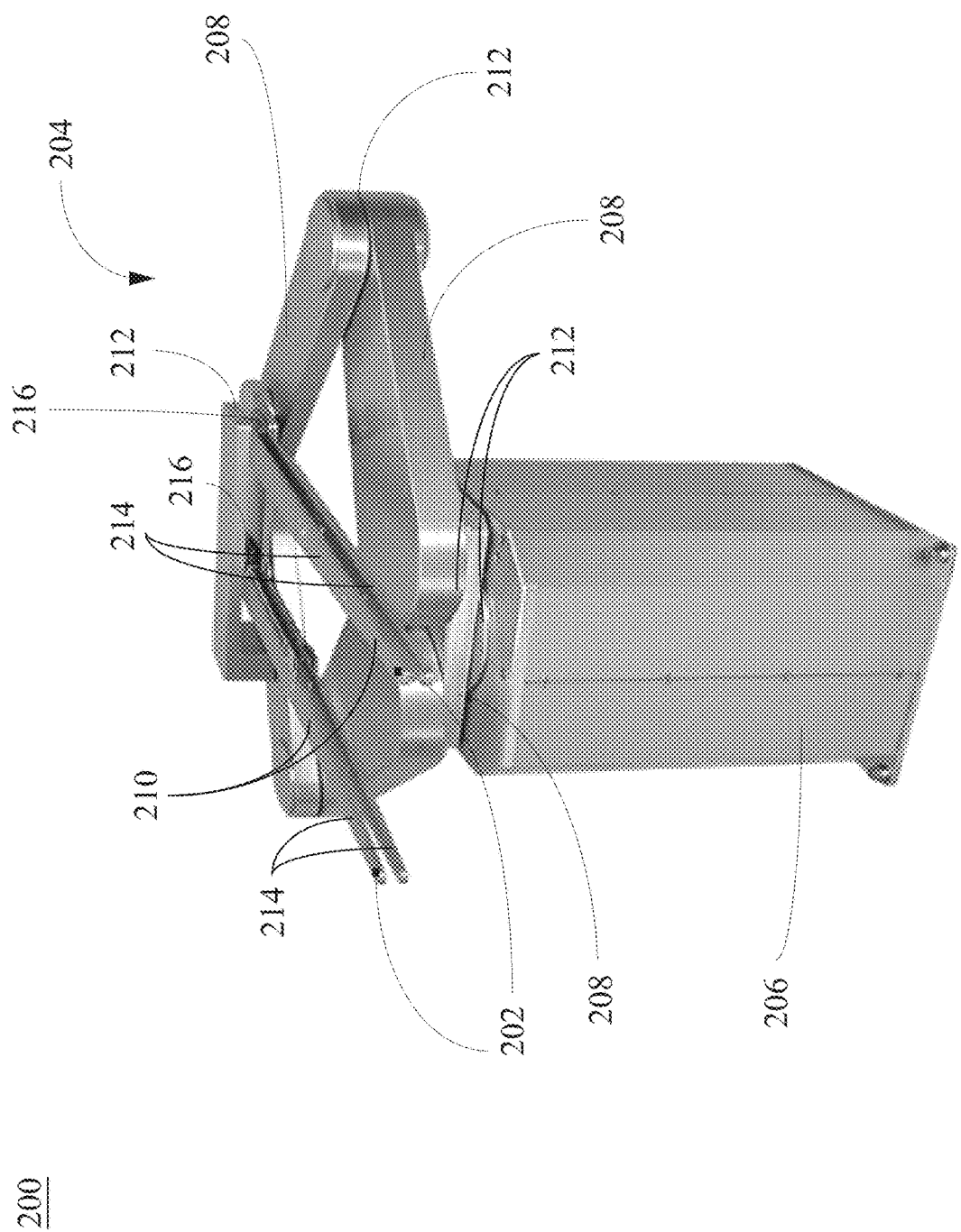
FIG. 2 is an illustration of a gripper hand sensor on a robotic arm, in accordance with some embodiments.

FIG. 2 is an illustration of a gripper hand sensor 202 on a robotic arm 204, in accordance with some embodiments. The robotic arm 204 may include a base 206, at least one link 208, and the gripper hand 210. The base 206, at least one link 208, and the gripper hand 210 may be interconnected via respective joints 212. Furthermore, each of the links 208 of the at least one link 208 may be also connected via respective joints 212. As noted above, the joints 212 may provide the robotic arm with degrees of freedom, or an amount of independent motions in which the gripper hand may be moved.

The gripper hand 210 may include at least two sets of opposed fingers 214. The set of opposed fingers 214 may act as a pressure gripper in a pincer type motion that slides into a wafer and then applies pressure to grasp the wafer so that the wafer is immobile while the gripper hand 210 is in motion. Each set of opposed fingers 214 may be opened or closed by a gripper hand joint 216 between the two fingers 214, that facilitates the movement of the gripper's fingers 214.

The links 208 and associated joints 212 may be configured to provide a rotational and/or lateral movement to the gripper hand 210. For example, each of the joints 212 may be configured to rotate and provide either rotation around an axis of rotation for the gripper hand 210 and/or lateral motion of the gripper hand such that the gripper hand 210 may be part of reaching and retraction motions.

The gripper hand sensor 202 may be any type of sensor configured for collection of sensor data as introduced above. It may be desirable for the gripper hand sensor to occupy as small a footprint as practical on the gripper hand 210 so as not to interfere with the operation of the gripper hand 210, or be damaged during operation of the gripper hand 210. The gripper hand sensor 202 may be any type of sensor, such as at least one of the sensors as discussed above. Although a single gripper hand sensor 202 is illustrated as being located on a finger 214 of a set of opposed fingers 214, gripper hand sensors 202 may be located in any location or in any number as desired for different applications in accordance with various embodiments. For example, the gripper hand sensor 202 may be embedded within the gripper hand 210 as opposed to being located on the gripper hand 210. Also, only one gripper hand sensor 202 may be utilized for only one of the multiple sets of opposed fingers 214. Furthermore, multiple gripper hand sensors 202 may be placed in a same place (e.g., as an integrated sensor with multiple sensor functionalities) or may be placed in different places (e.g., on opposite fingers 214 of a set of opposed fingers 214). Additionally, in certain embodiments, a gripper hand 210 may have an articulated finger where parts of the articulated finger are connected by at least one gripper hand joint and a sensor is mounted on one of the parts of the articulated finger or with a gripper hand joint.

Figure 3:
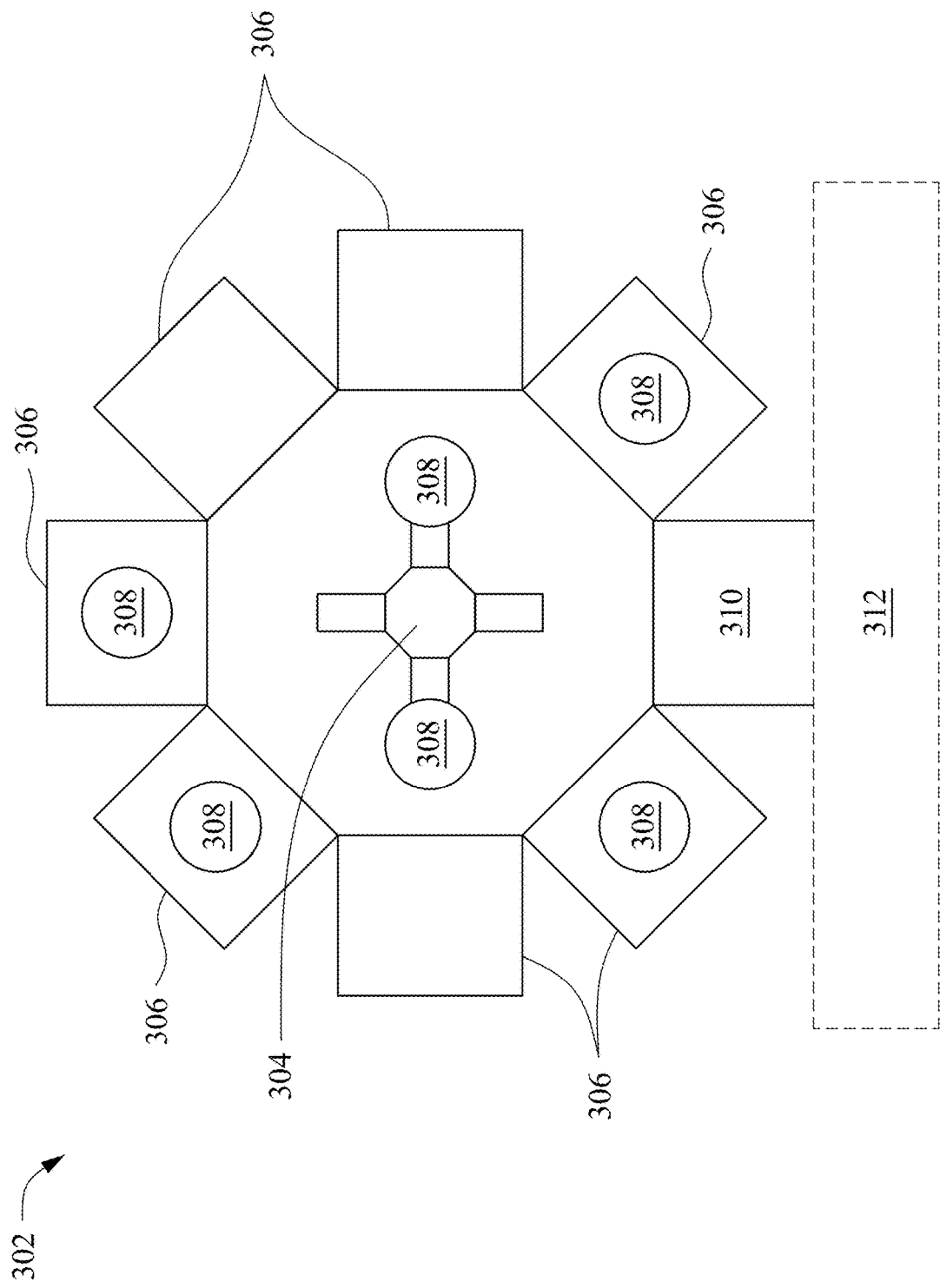
FIG. 3 is a block diagram that illustrates a transfer module in which a robotic arm may function, in accordance with some embodiments.

FIG. 3 is a block diagram that illustrates a transfer module 302 in which a robotic arm 304 may function, in accordance with some embodiments. The transfer module 302 may include multiple semiconductor processing chambers 306, each configured to receive a wafer 308 for semiconductor processing. Certain of the semiconductor processing chambers 306 may not include a wafer 308 while others may include a wafer 308 at a point in time. The transfer module 302 may also include a load port 310 that interfaces with an automated material handling system 312 that may bring wafers 308 into and out of the load port 310. The transfer module 302 may include the robotic arm 304 configured to transfer wafers among the semiconductor processing chambers 306 and the load port 310.

The chambers 306 may include any semiconductor processing chamber for receipt and processing of a wafer or other semiconductor device. Example processes that may be performed in these semiconductor processing chambers include processes related to physical vapor deposition (PVD), chemical vapor deposition (CVD), chemical mechanical planarization (CMP), diffusion (DIF), wet etching, dry etching, photolithography, after developed inspection (ADI), after etched inspection (AEI), critical dimension (CD) inspection, scanning electron microscope (SEM) inspection, critical dimension scanning electron microscope (CD-SEM) inspection, wet cleaning, dry cleaning, and plasma etching.

Figure 4:
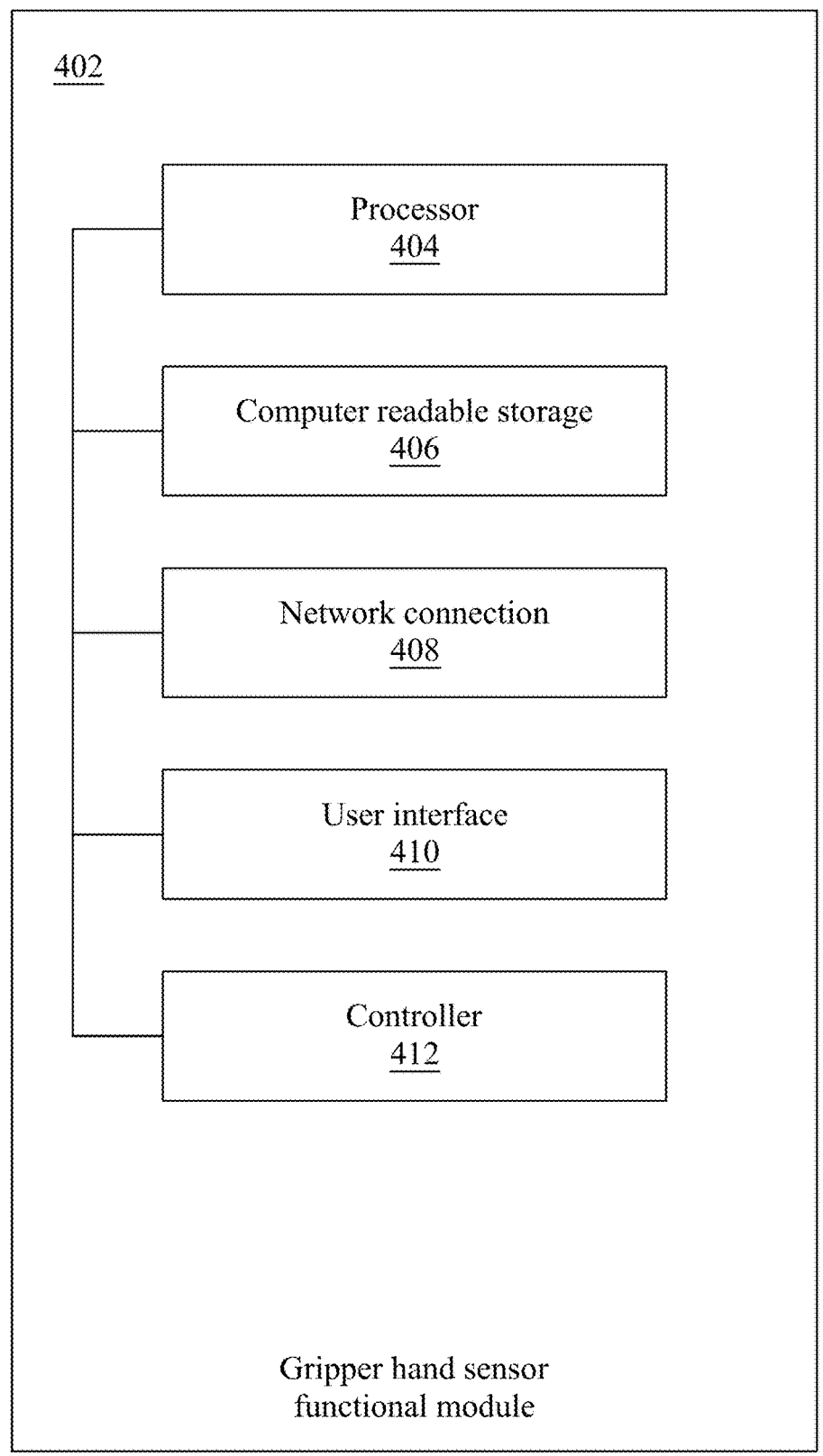
FIG. 4 is a block diagram of various functional modules of a gripper hand sensor functional module, in accordance with some embodiment.

FIG. 4 is a block diagram of various functional modules of a gripper hand sensor functional module 402, in accordance with some embodiment. The gripper hand sensor functional module 402 may be part of a robotic arm system that includes the robotic arm discussed above. The gripper hand sensor functional module 402 may include a processor 404. In further embodiments, the processor 404 may be implemented as one or more processors.

The processor 404 may be operatively connected to a computer readable storage module 406 (e.g., a memory and/or data store), a network connection module 408, a user interface module 410, a controller module 412, and a sensor module 414. In some embodiments, the computer readable storage module 406 may include gripper hand sensor process logic that may configure the processor 404 to perform the various processes discussed herein. The computer readable storage may also store data, such as sensor data collected by the sensors, data for identifying an adverse condition, identifiers for a wafer, identifiers for a robotic arm, identifiers for a gripper hand, identifiers for a sensor, and any other parameter or information that may be utilized to perform the various processes discussed herein.

The network connection module 408 may facilitate a network connection of the robotic arm system with various devices and/or components of the robotic arm system that may communicate within or external to the gripper hand sensor functional module 402. In certain embodiments, the network connection module 408 may facilitate a physical connection, such as a line or a bus. In other embodiments, the network connection module 408 may facilitate a wireless connection, such as over a wireless local area network (WLAN) by using a transmitter, receiver, and/or transceiver. For example, the network connection module 408 may facilitate a wireless or wired connection with various gripper hand sensors, the processor 404 and the controller module 412.

The gripper hand sensor functional module 402 may also include the user interface module 410. The user interface may include any type of interface for input and/or output to an operator of the robotic arm system, including, but not limited to, a monitor, a laptop computer, a tablet, or a mobile device, etc.

The gripper hand sensor functional module 402 may include a controller module 412. The controller module 412 may be configured to control various physical apparatuses that control movement or functionality of the robotic arm and/or components of the robotic arm. For example, the controller module 412 may be configured to control movement or functionality for at least one of a link, the gripper hand, fingers, a gripper hand sensor, a sensor tool and/or joints. For example, the controller module 412 may control a motor that may move at least one of a joint, a finger, a gripper hand, a sensor, a sensor tool, and/or a link of a robotic arm. The controller may be controlled by the processor and may carry out the various aspects of the various processes discussed herein.

Figure 5:
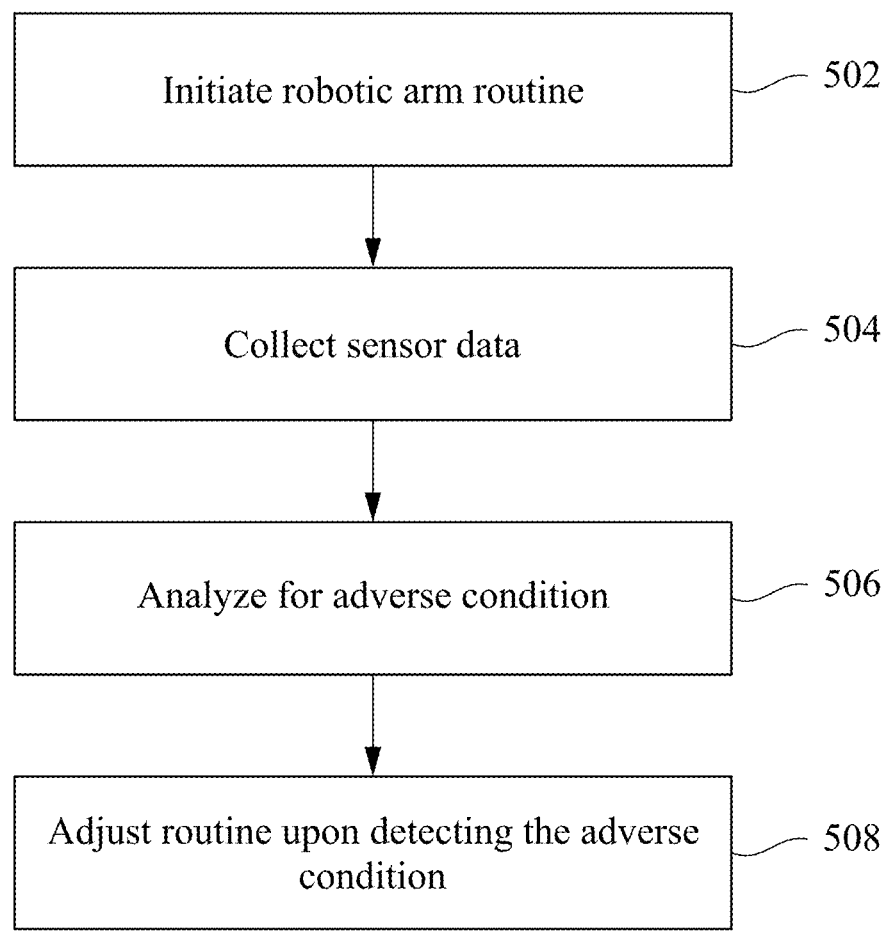
FIG. 5 is a flow chart of a gripper hand sensor process, in accordance with some embodiments.

FIG. 5 is a flow chart of a gripper hand sensor process, in accordance with some embodiments. The gripper hand sensor process may be performed by a robotic arm system, as discussed above. It is noted that the process 500 is merely an example, and is not intended to limit the present disclosure. Accordingly, it is understood that additional operations may be provided before, during, and after the process 500 of FIG. 5, certain operations may be omitted, certain operations may be performed concurrently with other operations, and that some other operations may only be briefly described herein.

At operation 502, a robotic arm routine may be initiated at the robotic arm system. The robotic arm routine may include any set of predetermined set of operations for a robotic arm. For example, a robotic arm routing may include iterations of picking a wafer up from a first location, moving the wafer to a second location, depositing the wafer at the second location for semiconductor processing (e.g., in a semiconductor processing chamber), retrieving the wafer from the second location after semiconductor processing, and returning the wafer to the first location (e.g., such as a load port or an automated material handling system so that the wafer may be transported for further processing). Typically, a robotic arm may perform multiple iterations of the robotic arm routine in the performance of semiconductor processing. For example, the robotic arm of a robotic arm system may transfer multiple wafers between different locations at different times, where each wafer may be transferred in a same manner and among the same locations. Each of these locations may be locations for which wafers may be located and/or processed in the course of semiconductor processing (e.g., as a station of an assembly line). In certain embodiments, the robotic arm may perform the processing, instead of being an instrument of transfer of the wafer between different chambers or stations for semiconductor processing.

At operation 502, sensor data may be collected at a gripper hand sensor of the robotic arm system. The collection of sensor data may occur in real time as the robotic arm routine is being performed. This sensor data may be utilized for analysis of whether an adverse condition is present. In various embodiments, the sensor data may be stored locally at the respective sensor that collected the sensor data and/or may be stored in the computer readable storage discussed above.

As introduced above, the gripper hand sensor may be any type of sensor utilized to collect sensor data. For example, a radar monitor sensor may collect frequency modulated continuous wave (FMCW) sensor data that can be utilized to determine a velocity, speed, or rate of movement as well as distances to objects. An image sensor may collect image data that can be utilized to characterize an image or a video of the surroundings of the gripper hand. A weight sensor may collect real time weight sensor data that characterizes a wafer weight. An electronic nose sensor may collect gas molecule sensor data (e.g., the presence of particular gas molecules). A range finder, such as an infrared range finder may collect infrared range data on distances to a surface (e.g., distance form a gripper hand to a surface of the chamber). A thermometer, such as an infrared thermometer, may be utilized to determine the temperature at the gripper hand.

In addition, various sensor tools that may facilitate the gathering of sensor data may also be collocated, or proximal to a respective gripper hand sensor. For example, a light source, such as a micro laser emitting diode (LED) light, may be a sensor tool for an image sensor to illuminate an area from which sensor data is collected. As another example of a sensor tool, a gas nozzle and/or a vacuum tip may be utilized to facilitate detection of gas molecules by the electronic nose sensor. For example, the vacuum tip may be utilized to vacuum or bring gas molecules toward the electronic nose sensor and the gas nozzle may be utilized to eject gas molecules away from the electronic nose sensor.

At operation 506, the sensor data may be analyzed by the robotic arm system to determine whether an adverse condition has occurred. Specifically, the gripper hand sensor functional module may perform this analysis based upon the sensor data gathered by at least one gripper hand sensor. An adverse condition may be any condition for which it may be desirable to stop or modify a robotic arm routine. For example, an adverse condition may be a prediction of an imminent collision of a gripper hand with a surface, such as a wall of a chamber. This type of adverse condition may be detected by utilizing a sensor such as a range finder or a radar monitor to determine a closeness or trajectory of a gripper hand during the robotic arm routine and triggering an adverse condition when the distance of a gripper hand to a surface, such as a wall of a semiconductor processing chamber, is below a threshold value (e.g., a minimum safe distance between a gripper hand (or a gripper hand sensor) to the surface).

As another example of an adverse condition, sensor data from an image sensor may be collected and analyzed to determine whether an adverse condition such as a fire or other abnormality is present from the image sensor data. For example, the gripper hand sensor functional module may analyze the image sensor data for indicia of a fire via conventional image analysis techniques.

As yet another example of an adverse condition, sensor data from a weight sensor may collect real time weight sensor data that characterizes a wafer weight to detect wafer chipping or breakages. For example, the gripper hand sensor functional module may monitor wafer weight sensor data and detect an adverse condition when the wafer weight is below a minimum weight threshold (which may be indicative of a chipped, broken, or incomplete wafer) or above a maximum weight threshold (which may be indicative of a wafer with an undesirable artifact on it, such as another wafer or an artifact that inadvertently fell on the intended wafer for transport by the gripper hand).

As yet another example of an adverse condition, sensor data from an electronic nose sensor may be analyzed to determine whether there is an undesirable presence of a particular molecule or molecular concentration of a particular molecule. For example, an adverse condition may be determined if sensor data from an electronic nose sensor detects an abnormal concentration of a particular gas.

As yet another example of an adverse condition, sensor data from a temperature sensor may be analyzed to determine where there is an abnormal condition during semiconductor processing, such as overheating or overcooling when an operational temperature detected by the temperature sensor exceeds a threshold value or is under a threshold value.

At operation 508, a robotic arm routine may be modified or adjusted by the robotic arm system based on the detection of the adverse condition. Accordingly, as the gripper hand is moved, sensor data may be collected from the perspective of the gripper hand to ascertain whether an adverse condition is present so as to compensate for the detected adverse condition. In certain embodiments, upon detection of a particular adverse condition, the robotic arm routine may pause and/or move to a restart position. For example, upon detection of a robotic arm routine that detects an adverse condition (e.g., a distance of a gripper hand to a surface being below a threshold value), the robotic arm routine may be stopped and the robotic arm reset back (e.g., retracted) to an earlier position to restart or continue the robotic arm routine.

In particular embodiments, the robotic arm routine may be stopped for an indefinite period of time pending remediation of the detected adverse condition without moving to an earlier position. For example, certain types of adverse conditions (e.g., a failure of the robotic arm or a semiconductor processing chamber) may not be resolvable from a reboot, or restarting the robotic arm routine.

In further embodiments, the robotic arm routine may be adjusted upon detection of a particular adverse condition by reconfiguring the robotic arm system to execute a different or a new robotic arm routine than the robotic arm routine being executed when the adverse condition was detected. For example, based upon detection of an adverse condition detected in a particular semiconductor processing chamber, the robotic arm system may restart or continue in execution of a different robotic arm routine that avoids the semiconductor processing chamber in which the adverse condition was detected.

Although particular adverse conditions, sensor data, and robotic arm routine adjustments are discussed above, other adverse conditions, sensor data, and robotic arm routine adjustments may be utilized in the performance of a gripper hand sensor process as desired for different applications in accordance with various embodiments. For example, a combination of different sensor data may be collected and cross referenced to determine the occurrence of an adverse condition.

In an embodiment, a robotic arm includes: a base; at least one link secured to the base; a gripper secured to the at least one link, wherein: the gripper comprises a finger, the gripper is configured to secure a wafer while the at least one link is in motion, and the gripper is configured to release the wafer while the at least one link is stopped, a sensor disposed on the finger, the sensor configured to collect sensor data characterizing the robotic arm's interaction with a semiconductor processing chamber while the wafer is secured using the finger.

In another embodiment, a system includes: a stabilization base; a link secured to the stabilization base; a gripper hand secured to the link, wherein: the gripper hand is configured to secure a wafer while the link is in motion, the gripper hand is configured to release the wafer while the link is stopped, and a sensor is disposed on the gripper hand.

In another embodiment, a method includes: collecting sensor data from a sensor at a gripper hand, wherein: the sensor data characterizes a relationship between a semiconductor processing chamber and the gripper hand, and the gripper hand secures a wafer while the gripper hand is in motion; detecting an adverse condition based on the sensor data; and controlling the gripper hand in response to detecting the adverse condition.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Conditional language such as, among others, "can," "could," "might" or "may," unless specifically stated otherwise, are otherwise understood within the context as used in general to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Additionally, persons of skill in the art would be enabled to configure functional entities to perform the operations described herein after reading the present disclosure. The term "configured" as used herein with respect to a specified operation or function refers to a system, device, component, circuit, structure, machine, etc. that is physically or virtually constructed, programmed and/or arranged to perform the specified operation or function.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

It should be emphasized that many variations and modifications may be made to the above-described embodiments, the elements of which are to be understood as being among other acceptable examples. All such modifications and variations are intended to be included herein within the scope of this disclosure and protected by the following claims.

What is claimed is:

1. A method, comprising:
    collecting sensor data from a sensor at a gripper hand, wherein:
        the sensor data characterizes a relationship between a semiconductor processing chamber and the gripper hand, and
        the gripper hand secures a wafer while the gripper hand is in motion;
    detecting an adverse condition based on the sensor data; and
    controlling the gripper hand in response to detecting the adverse condition,
    wherein the sensor comprises an electronic nose configured to measure a concentration of a gas molecule around the gripper hand.

2. The method of claim 1, further comprising:
    executing a robotic arm routine using the gripper hand; and
    modifying the robotic arm routine in response to detecting the adverse condition.

3. The method of claim 1, further comprising:
    retracting the gripper hand to a restart position in response to the detecting the adverse condition.

4. The method of claim 1, the sensor data is at least one of: image data, distance data, temperature data, gas composition data, wafer weight data, and gripper hand movement speed.

5. The method of claim 1, wherein the adverse condition comprises a value of the sensor data exceeding a threshold.

6. The method of claim 1, wherein the adverse condition is a detection of less than a threshold distance between the sensor and a surface.

7. A method, comprising:
securing a wafer with a gripper configured to transport the wafer to a predetermined location within a processing chamber; and
collect first sensor data using a first sensor disposed on the gripper, wherein first sensor data characterizes a condition within a semiconductor processing chamber while the wafer is secured using the gripper, wherein the first sensor comprises an electronic nose configured to measure a concentration of a gas molecule around the gripper.

8. The method of claim 7, further comprising collecting second sensor data using a second sensor coupled to the gripper, wherein the second sensor data indicates a weight of the wafer.

9. The method of claim 7, further comprising collecting second sensor data using a second sensor coupled to the gripper, wherein the second sensor data characterizes a spatial relationship between the gripper and a surface of the semiconductor processing chamber.

10. The method of claim 7, wherein the gripper is configured to move between multiple semiconductor processing chambers.

11. The method of claim 7 wherein the gripper hand comprises a set of fingers configured to secure the wafer or to release the wafer, and wherein the first sensor is disposed on a finger of the set of fingers.

12. The method of claim 7, further comprising collecting image data using a second sensor coupled to the gripper.

13. The method of claim 7, further comprising collecting temperature data using a second sensor coupled to the gripper.

14. The method of claim 7, further comprising collecting gripper movement speed data using a second sensor coupled to the gripper.

15. A method, comprising:
providing a stabilization base;
securing a link to the stabilization base;
securing a gripper hand to the link, wherein the gripper hand is configured to secure a wafer while the link is in motion, and the gripper hand is configured to release the wafer while the link is stopped; and
coupling a first sensor to the gripper hand, wherein the first sensor comprises an electronic nose configured to measure a concentration of a gas molecule around the gripper.

16. The method of claim 15, wherein the gripper hand comprises a set of fingers configured to secure the wafer or to release the wafer.

17. The method of claim 16, wherein the first sensor is disposed on a finger of the set of fingers.

18. The method of claim 17, wherein the finger comprises articulated joints and the first sensor is part of one of the articulated joints.

19. The method of claim 15, further comprising coupling a second sensor to the gripper, wherein the second sensor is configured to collect data indicating a weight of the wafer.

20. The method of claim 15, further comprising coupling a second sensor to the gripper, wherein the second sensor is configured to collect data indicating a spatial relationship between the gripper hand and a semiconductor processing chamber surface.

* * * * *